US011840602B2

(12) United States Patent
Tu et al.

(10) Patent No.: US 11,840,602 B2
(45) Date of Patent: *Dec. 12, 2023

(54) LAMINATE, CIRCUIT BOARD, AND LIQUID CRYSTAL POLYMER FILM APPLIED TO THE SAME

(71) Applicant: Chang Chun Plastics Co., Ltd., Taipei (TW)

(72) Inventors: An-Pang Tu, Taipei (TW);
Chien-Chun Chen, Taipei (TW);
Chia-Hung Wu, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/126,413

(22) Filed: Dec. 18, 2020

(65) Prior Publication Data

US 2021/0189059 A1   Jun. 24, 2021

Related U.S. Application Data

(60) Provisional application No. 62/952,553, filed on Dec. 23, 2019.

(51) Int. Cl.
| | |
|---|---|
| B32B 15/04 | (2006.01) |
| C08G 63/06 | (2006.01) |
| C08G 63/83 | (2006.01) |
| C08J 5/18 | (2006.01) |
| H05K 1/03 | (2006.01) |
| B32B 15/20 | (2006.01) |
| B32B 15/09 | (2006.01) |
| B32B 27/36 | (2006.01) |
| C08G 63/60 | (2006.01) |
| C08L 67/04 | (2006.01) |
| C09K 19/38 | (2006.01) |
| B29C 41/12 | (2006.01) |
| B29D 7/01 | (2006.01) |
| B29K 67/00 | (2006.01) |
| B29K 105/00 | (2006.01) |

(52) U.S. Cl.
CPC ............ *C08G 63/065* (2013.01); *B29C 41/12* (2013.01); *B29D 7/01* (2013.01); *B32B 15/09* (2013.01); *B32B 15/20* (2013.01); *B32B 27/36* (2013.01); *C08G 63/06* (2013.01); *C08G 63/60* (2013.01); *C08G 63/83* (2013.01); *C08J 5/18* (2013.01); *C08L 67/04* (2013.01); *C09K 19/3809* (2013.01); *H05K 1/032* (2013.01); *B29K 2067/00* (2013.01); *B29K 2105/0079* (2013.01); *B32B 2250/03* (2013.01); *B32B 2250/40* (2013.01); *B32B 2305/55* (2013.01); *B32B 2307/538* (2013.01); *B32B 2307/704* (2013.01); *B32B 2307/732* (2013.01); *B32B 2457/08* (2013.01); *C08G 2250/00* (2013.01); *C08J 2367/04* (2013.01); *C08L 2203/16* (2013.01); *H05K 2201/0141* (2013.01)

(58) Field of Classification Search
CPC ..... B32B 15/09; B32B 15/20; B32B 2457/08; C08G 63/065

See application file for complete search history.

(56) References Cited

U.S. PATENT DOCUMENTS

| | | |
|---|---|---|
| 5,534,209 A | 7/1996 | Moriya |
| 5,746,949 A | 5/1998 | Shen et al. |
| 5,998,804 A | 12/1999 | Suh et al. |
| 6,859,241 B2 | 2/2005 | Hamamoto |
| 9,874,439 B2 | 1/2018 | Bucher |
| 2002/0060309 A1 | 5/2002 | Jester |
| 2006/0048963 A1 | 3/2006 | Nishinaka et al. |
| 2009/0033839 A1 | 2/2009 | Fukuda |

(Continued)

FOREIGN PATENT DOCUMENTS

| | | |
|---|---|---|
| CN | 1235173 A | 11/1999 |
| CN | 101423652 A | 5/2009 |

(Continued)

OTHER PUBLICATIONS

Examination Report of JP2020-021487 dated Jul. 28, 2020.
Notice of Allowance of JP2020-021487 dated Nov. 4, 2020.
Examination Report of KR10-2020-0044558 dated Jun. 29, 2020.
Notice of Allowance of KR10-2020-0044558 dated Nov. 24, 2020.

(Continued)

*Primary Examiner* — Elizabeth E Mulvaney
(74) *Attorney, Agent, or Firm* — WPAT, PC (57) ABSTRACT

Provided are a laminate, a circuit board, and a liquid crystal polymer (LCP) film comprised therein. The laminate comprises a metal foil and an LCP film. The LCP film in the laminate has a dissipation factor before water absorption ($Df_0$), a dissipation factor after water absorption ($Df_1$), and a relative percentage difference between dissipation factors ($\Delta Df$), which is calculated by the following equation:

$$\Delta Df(\%) = \frac{|Df_1' - Df_0'|}{Df_0'} \times 100\%;$$

wherein $\Delta Df$ may be less than or equal to 16%.

By controlling $\Delta Df$ of the LCP film in the laminate, the insertion loss of a circuit board comprising a laminate during signal transmission in low-, medium-, and/or high-frequency bands is decreased and/or inhibited. In addition, the difference between the insertion losses of signal transmission before and after water absorption is decreased, so the laminate is suitable for high-end or outdoor high-frequency electronic products.

14 Claims, 5 Drawing Sheets

(56) References Cited

U.S. PATENT DOCUMENTS

| | | | |
|---|---|---|---|
| 2014/0135469 A1 | 5/2014 | Kim et al. | |
| 2017/0347464 A1 | 11/2017 | Hashizume | |
| 2018/0147815 A1 | 5/2018 | Hashizume | |
| 2018/0230317 A1 | 8/2018 | Seo | |
| 2019/0090970 A1 | 3/2019 | Nichogi | |
| 2019/0091970 A1 | 3/2019 | Ueki | |
| 2019/0160728 A1 | 5/2019 | Higashioji | |
| 2019/0352456 A1 | 11/2019 | Hsiang et al. | |
| 2020/0407639 A1 | 12/2020 | Liao | |
| 2021/0187884 A1* | 6/2021 | Tu | C08G 63/60 |
| 2021/0189118 A1* | 6/2021 | Tu | B32B 7/022 |
| 2021/0189242 A1* | 6/2021 | Tu | B32B 27/36 |

FOREIGN PATENT DOCUMENTS

| | | |
|---|---|---|
| CN | 101921469 A | 12/2010 |
| CN | 102085708 A | 6/2011 |
| CN | 102574362 A | 7/2012 |
| CN | 103069933 A | 4/2013 |
| CN | 109180979 A | 1/2019 |
| CN | 109196716 A | 1/2019 |
| CN | 110073282 A | 7/2019 |
| CN | 112586096 A | 3/2021 |
| CN | 115768820 A | 3/2023 |
| EP | 34424703 A1 | 1/2019 |
| JP | S59-157115 A | 9/1984 |
| JP | H03-017156 A | 1/1991 |
| JP | H05-214253 A | 8/1993 |
| JP | H06-240019 A | 8/1994 |
| JP | H07-251438 A | 10/1995 |
| JP | H08-090570 A | 4/1996 |
| JP | H08-281817 A | 10/1996 |
| JP | 258751 B2 | 3/1997 |
| JP | 2962459 B2 | 10/1999 |
| JP | 2000063551 A | 1/2000 |
| JP | 2000044797 A | 2/2000 |
| JP | 2003-340918 A | 12/2003 |
| JP | 2004-323663 A | 11/2004 |
| JP | 2005-297405 A | 10/2005 |
| JP | 2006-001185 A | 1/2006 |
| JP | 2006-249159 A | 9/2006 |
| JP | 3896324 B2 | 3/2007 |
| JP | 2007-092036 A | 4/2007 |
| JP | 2007-126578 A | 5/2007 |
| JP | 2007-203702 A | 8/2007 |
| JP | 2007-217579 A | 8/2007 |
| JP | 4091209 B2 | 5/2008 |
| JP | 2008-221488 A | 9/2008 |
| JP | 2008-291168 A | 12/2008 |
| JP | 2009164596 A | 7/2009 |
| JP | 2010-076295 A | 4/2010 |
| JP | 2010147442 A | 7/2010 |
| JP | 2011-5803 A | 1/2011 |
| JP | 2011054945 A | 3/2011 |
| JP | 2011071815 A | 4/2011 |
| JP | 2011-216598 A | 10/2011 |
| JP | 2012-089608 A | 5/2012 |
| JP | 2012-167224 A | 9/2012 |
| JP | 2012-169598 A | 9/2012 |
| JP | 2012-186453 A | 9/2012 |
| JP | 2013-158935 A | 8/2013 |
| JP | 2013155415 A | 8/2013 |
| JP | 2014-060449 A | 4/2014 |
| JP | 2014208438 A | 11/2014 |
| JP | 2015-066910 A | 4/2015 |
| JP | 2015077783 A | 4/2015 |
| JP | 2016084528 A | 5/2016 |
| JP | 2016-107505 A | 6/2016 |
| JP | 2016-131193 A | 7/2016 |
| JP | 2016129949 A | 7/2016 |
| JP | 2016537514 A | 12/2016 |
| JP | 2017-031442 A | 2/2017 |
| JP | 2017-135216 A | 8/2017 |
| JP | 2017189894 A | 10/2017 |
| JP | 6277576 B2 | 2/2018 |
| JP | 2018028147 A | 2/2018 |
| JP | 2018-121085 A | 8/2018 |
| JP | 2018-172785 A | 11/2018 |
| JP | 2018-172790 A | 11/2018 |
| JP | 2018168409 A | 11/2018 |
| JP | 2019-043980 A | 3/2019 |
| JP | 2019-117414 A | 7/2019 |
| JP | 2019-123255 A | 7/2019 |
| JP | 2019135301 A | 8/2019 |
| JP | 2019-152853 A | 9/2019 |
| JP | 2022-508617 A | 1/2022 |
| KR | 10-2005-0043649 A | 5/2005 |
| KR | 10-2019-0077767 A | 7/2009 |
| KR | 10-2011-0103068 A | 9/2011 |
| KR | 10-2012-0074230 A | 7/2012 |
| KR | 2016-0065942 A | 6/2016 |
| KR | 10-2017-1013835 A | 9/2017 |
| TW | 201417646 A | 5/2014 |
| TW | 201533280 A | 9/2015 |
| TW | 201928029 A | 7/2019 |
| TW | 201939077 A | 10/2019 |
| TW | 201941933 A | 11/2019 |
| TW | I697549 B | 7/2020 |
| WO | WO2010093009 A1 | 8/2010 |
| WO | 2010139053 A1 | 12/2010 |
| WO | 2011/118449 A1 | 9/2011 |
| WO | 2011111826 A1 | 9/2011 |
| WO | 2012/117850 A1 | 9/2012 |
| WO | WO2013021893 A1 | 2/2013 |
| WO | WO2013108563 A1 | 7/2013 |
| WO | 2014/046014 A1 | 3/2014 |
| WO | 2016104420 A | 6/2016 |
| WO | WO2016136537 A | 9/2016 |
| WO | WO2016159060 A1 | 10/2016 |
| WO | WO2016170779 A1 | 10/2016 |
| WO | WO2016174868 A1 | 11/2016 |
| WO | 2016194964 A | 12/2016 |
| WO | 2018/181223 A1 | 10/2018 |
| WO | WO2018181222 A1 | 10/2018 |
| WO | WO2018186223 A1 | 10/2018 |
| WO | 2020/009230 A1 | 1/2020 |
| WO | 2020/149324 A1 | 7/2020 |
| WO | WO2020156181 A1 | 8/2020 |
| WO | 2021/256491 A1 | 12/2021 |

OTHER PUBLICATIONS

Examination Report of U.S. Appl. No. 16/748,846 dated Sep. 10, 2020.
Final Rejection of U.S. Appl. No. 16/748,846 dated Dec. 9, 2020.
Rejection of RCE of U.S. Appl. No. 16/748,846 dated Apr. 2, 2021.
Examination Report of TW108147226 dated Mar. 13, 2020.
Notice of Allowance of TW108147226 dated May 19, 2020.
Examination Report of TW109144672 dated Feb. 23, 2021.
Examination Report of TW109144673 dated Mar. 23, 2021.
Examination Report of TW109144674 dated Feb. 25, 2021.
Authors: MahaA Mekkawy et al.; Title: Comparative study of surface roughness between polyamide, thermoplastic polymethyl methacrylate and acetal resins flexible denture base materials before and after polishing; Published Date: Oct. 7, 2015.
Third Party Observation 2 of JP2020-166621 (receiving date: Mar. 8, 2022).
Third Party Observation of JP2020-210284 (receiving date: Apr. 12, 2022).
Evaluation of the strength of single lap joint by using geomertrical and adhesive color information (2015).
Web page for introduction of kurtosis.
IPAB Decision on Appeal of KR10-2020-0044558 (receiving date: May 17, 2022).
Final Examination Report of KR10-2020-0180073 (receiving date: Apr. 28, 2022).
Examination Report of KR10-2020-0128117 (receiving date: Jun. 22, 2022).
Examination Report of U.S. Appl. No. 16/748,846 (receiving date: May 17, 2022).

(56) References Cited

OTHER PUBLICATIONS

Third Party Observation of JP2020-210284 (receiving date: May 23, 2022).
Resilience Brother, 5G communication material—liquid crystal polymer LCP (2020), Text/Meter Polymer.
Hajnys et al. Quality of Surface Texture (2021) Polymers, MDPI.
Recent Market and Application Development of Liquid Crystal Polymers (2003).
Wang, Synthesis and Self-assembled Nanostructures of Rectangular Liquid Crystals (2007) National Chiao Tung Unversity, Taiwan.
Technologies & Applications of LCP (2004).
Vecstar catalog, Kuraray Co. Ltd. (2012), Japan.
Tanaka et al. LCP material for LSI Mounting (1999).
6-hydroxy-2-naphthoic acid, Tcichemicals.com, Japan.
4-hydroxybenzoic acid, Wikipedia.
Okamoto et al. Newly developed LCP film (2005), Sumitomo Chemical Co. Ltd., Japan.
Examination Report of KR10-2020-0180055 (receiving date: Dec. 10, 2021).
Examination Report of KR10-2020-0128117 (receiving date: Dec. 22, 2021).
Examination Report of KR10-2020-0180073 (receiving date: Dec. 29, 2021).
Vlachopoulos J., Polychronopoulos N.D., Tanifuji S., Peter Müller J. (2012).
Examiner's Answer to Appeal Brief of U.S. Appl. No. 16/748,846 (receiving date: Dec. 20, 2021).
Notice of Allowance of JP2020-210267 (receiving date: Jan. 11, 2022).
Notice of Cancellation Grounds of KR10-2020-0044558 (receiving date: Dec. 27, 2021).
Third Party Observation of KR10-2020-0128117 (receiving date: Feb. 4, 2022).
Third Party Observation of KR10-2020-0180073 (receiving date: Feb. 22, 2022).
Examination Report of JP2020-199487 (receiving date: Aug. 26, 2021).
Examination Report of JP2020-210267(receiving date: Oct. 8, 2021).
Examination Report of JP2020-210276(receiving date: Oct. 14, 2021).
Third Party Observation of JP2020-210276(receiving date: Oct. 20, 2021).
Notice of Panel Decision from Pre-Appeal Brief Review of U.S. Appl. No. 16/748,846(receiving date: Sep. 17, 2021).
Examination Report of JP2020-166621(receiving date: Nov. 5, 2021).
Third Party Observation of JP2020-166621(receiving date: Oct. 28, 2021).
Patent Board Decision of U.S. Appl. No. 16/748,846 (receiving date: Apr. 11, 2022).
Examination Report of U.S. Appl. No. 17/012,105 (receiving date: Mar. 11, 2022).
Third Party Observation 1 of JP2020-166621 (receiving date: Mar. 8, 2022).
Examination Report of JP2020-199487 (receiving date: Mar. 22, 2022).
Examination Report of JP2020-166621 (receiving date: Apr. 19, 2022).
Final Examination Report of JP2020-210276 (receiving date: Mar. 15, 2022).
Third Party Observation of KR10-2020-1080090 (receiving date: Feb. 22, 2022).
Notice of Allowance of KR10-2020-0180055 (received date: Apr. 14, 2022).
Catalog of Fukuda Metal Foil & Powder Co., Ltd. (2015).
Technical Report of Panasonic Corporation (2011).
Japanese dictionary Kojien 7th edition.
Technical Report of IEICE (1999).
Measures against molding defects in easy extrusion molding (1984).
Web page for Surface Roughness Measurement-Parameters.
The 26th Spring Lecture Meeting of the Electronics Packaging Society (2012).
Convertech, 2001.
Taiwan Examination Report of related TW 109117530 (receiving date: May 24, 2021).
Taiwan Notice of Allowance of related TW 109117530 (receiving date: Aug. 6, 2021).
Japan Statement of Opposition of related JP 6804673 (receiving date: Jul. 16, 2021).
Korea Statement of Opposition of related KR 10-2197515 (receiving date: Aug. 6, 2021).
Author: MISUMI Co., title: Misumi-vona technical report, URL:https://jp.misumi-ec.com/tech-info/categories/technical_data/td01/g0103.html (upload date: Mar. 6, 2021).
Notice of Allowance of TW109144672 (receiving date: Jun. 17, 2021).
Notice of Allowance of TW109144673 (receiving date: Aug. 19, 2021).
Notice of Allowance of TW109144674 (receiving date: May 6, 2021).
Notice of Allowance for Appeal of JP2020-210276 (receiving date: Aug. 2, 2022).
Examination Report of U.S. Appl. No. 17/126,446 (receiving date: Aug. 23, 2022).
Examination Report of JP2020-210284 (receiving date: Aug. 2, 2022).
Third Party Observation of JP2020-199487 (receiving date: Dec. 14, 2021).
Examination Report of U.S. Appl. No. 17/012,105 (receiving date: Aug. 5, 2022).
Third Party Observation of U.S. Appl. No. 17/502,213 (receiving date: Aug. 8, 2022).
Examination Report of U.S. Appl. No. 17/502,213 (receiving date: Oct. 6, 2022).
Final Examination Report of U.S. Appl. No. 16/748,846 (receiving date: Aug. 24, 2022).
Opposition 1 to JP2020-210267 (receiving date: Sep. 12, 2022).
Opposition 2 to JP2020-210267 (receiving date: Sep. 12, 2022).
Dielectrical characteristic & appli of LCP, 2015.
5G loss insertion, Aug. 2017. Nikkei Electronics.
Examination Report of JP2020-199487 (receiving date: Oct. 18, 2022).
Notice of Allowance of U.S. Appl. No. 17/012,105 (receiving date: Nov. 17, 2022).
Notice of Reason of Cancellation of JP2020-210267 (receiving date: Nov. 15, 2022).
Notice of Allowance of KR10-2020-0128117 (receiving date: Dec. 28, 2022).
Examination Report of U.S. Appl. No. 17/126,431 (receiving date: Oct. 18, 2022).
Examination Report of KR10-2020-0180090 (receiving date: Dec. 21, 2022).
Examination Report of CN202011494501.1 (receiving date: Jan. 5, 2023).
Final Examination Report of U.S. Appl. No. 17/126,446 (receiving date: Jan. 12, 2023).
Final Examination Report of KR10-2020-0180073 (receiving date: Oct. 29, 2022).
Third Party Observation of JP2020-166621 (receiving date: Dec. 6, 2022).
Corrected Notice of Allowance of U.S. Appl. No. 17/012,105 (receiving date: Dec. 23, 2022).
ULTRALAM3000 (May 10, 2011).
Rz, Rku, Ra of examples of JP2020-166621 (2021, 07, 01).
Nippon Fine Chemical-TT%.
LED light-color temperature(2019).
Insertion loss of common high frequency PCB.
Development of multilayer flex substrate with LCP film.
Analysis and comparison of the standard test methods(Nov. 20, 2005).
Email related to U.S. Appl. No. 17/012,105 received on Dec. 15, 2022 and its brief comment.

(56) References Cited

OTHER PUBLICATIONS

Email related to U.S. Appl. No. 17/126,413 received on Dec. 28, 2022 and its brief comment.
Examination Report of JP2020-166621 (receiving Jan. 17, 2023).
Examination Report of U.S. Appl. No. 16/748,846 (receiving Jan. 24, 2023).
Corrected NOA of U.S. Appl. No. 17/012,105 (receiving date: Jan. 23, 2023).
Third Party Observation of JP2020-210284 (receiving date: Jan. 24, 2023).
About the mechanical and electrical properties of polyethylene, Jun. 12, 2018, Tokyo Electric Power Company Holdings, Inc.
Examination Report of JP2020-210284 (dated Mar. 14, 2023).
Third Party Observation of JP2020-199487 (issuing date: Mar. 22, 2023).
Opposition to JP2020-210276 (issuing date: Mar. 24, 2023).
Notice of Allowance of U.S. Appl. No. 17/126,431 (dated Feb. 9, 2023).
Corrected NOA of U.S. Appl. No. 17/012,105 (dated Feb. 15, 2023).
Corrected NOA of U.S. Appl. No. 17/126,431 (dated Feb. 17, 2023).
Supplemental NOA 1 of U.S. Appl. No. 17/126,431 (dated Mar. 1, 2023).
Supplemental NOA 2 of U.S. Appl. No. 17/126,431 (dated Mar. 15, 2023).
Panasonic FELIOS LCP, published by Panasonic, Jun. 2019.
A Comparative Study of Aerosol Jet Printing on Polyimide and Liquid Crystal Polymer Substrates for RF Applications; Mohammed Alhendi et al.; Published in 2020 IEEE 70th Electronic Components and Technology (ECTC), Aug. 5, 2020.
Commercialization of Low Transmission Loss Flexible Multilayer Circuit Board Materials, published by Panasonic Holdings Co., Ltd., webpage <URL: https://news.panasonic.com/jp/press/jn170117-3>, Jan. 17, 2017.
Introduction of Roughness, published by KEYENCE corporation, webpage <URL: https://www.keyence.co.jp/ss/products/microscope/roughness/basics/type.jsp>, <URL: https://www.keyence.co.jp/ss/products/microscope/roughness/surface/parameters/sa.jsp> and <URL: https://www.keyence.co.jp/ss/products/microscope/surface/parameters.sz.jsp>, retrieved on Dec. 28, 2022.
Development trends of high-frequency compatible materials and their application to 5G and millimeter-wave radar, published by Technical information association, Jun. 7, 2019.
Development technology of liquid crystal polymer—High performance and high functionality, published by CMC Publishing Co., Ltd., Dec. 22, 2009.
Electronics Materials for the Ubiquitous Era, published by CMC Publishing Co., Ltd., Dec. 26, 2003.
Information of 4-Hydroxybenzoic Acid, published by Tokyo Chemical Industry Co., Ltd., webpage <URL: https://www.tcichemicals.com/JP/ja/p/H0207>, Dec. 18, 2021, retrieved from Internet Archive <https:/web.archieve.org/web/20230000000000*/https://www.tcichemicals.com/JP/jp/p/H0207> on Apr. 12, 2023.
2008 (Gyo-ke) No. 10096 Intellectual Property High Court Judgement, published by Intellectual Property High Court, Jan. 28, 2009.
ISO Home Page for ISO 25178 2:2021, published by International Organization for Standardization, webpage <https://www.iso.org/standard/74591.html>, Dec. 2021.
Examination Report of JP2020-199487 (dated Apr. 25, 2023).
Examination Report of U.S. Appl. No. 17/126,431 (dated May 3, 2023), USPTO.
Examination Report of CN202010073759.8 (dated May 20, 2023).
Notice of Allowance of U.S. Appl. No. 17/126,446 (dated Jun. 7, 2023).
Decision for Appeal of KR10-2020-0180073 (dated Jun. 7, 2023).
Examination Report of CN202020114494501.1 (dated Jun. 22, 2023).
Notice of Reasons of Cancellation of JP2020-210276 (dated Jun. 15, 2023).
Decision on Opposition of JP2020-210267 (dated Jun. 23, 2023).
Opinion of Patent Opponent 1 of JP2020-210267 (dated Jun. 23, 2023).
Opinion of Patent Opponent 2 of JP2020-210267 (dated Jun. 23, 2023).
Final Examination Report of U.S. Appl. No. 16/748,846 (dated Jul. 12, 2023).
Notice of Allowance of JP2020-166621 (dated Jun. 13, 2023).
[From light bulb color to daylight color] Explanation of the types of LED colors and their characteristics, webpage <URL: https://greenutility.co.jp/led-light-bulb-color/> May 24, 2022, Published by Green Utility Co., Ltd.
Precautions for high-speed serial transmission on printed wiring boards, printed by the opponent 1 of Japanese application No. 2020-210267 on Mar. 24, 2023, webpage <URL: https://www.ritael.co/jp.archive/20060401a04/>, Nov. 26, 2019, <https://web.archive.org/web/20191201000000*/https://ritael.co/jp.archive/20060401a04/> on Jul. 6, 2023, published by RITA Electronics Co., Ltd.
LED Lights: What is the difference between Warm White and Cool White?, webpage <URL: https://www.renovatorstore.com/au/blog/led-lights-what-is-the-difference-between-warm-white-and-cool-white/>, May 29, 2017, published by renovationstore.
What's the difference Between Warm White and Cool White LEDs?, printed by the opponent 2 of Japanese application No. 2020-210267 on Mar. 15, 2023, webpage <URL: https://socketstore.co.uk/page/help/lighting/leds-difference-between-warm-white-and-cool-white>, retreived from Internet Archive <https://web.archive.org/20211001000000*https://socketstore.co.uk/page/help/lighting/leds-difference-between-warm-white-and-cool-white> on Jul. 6, 2023, published by socketstore.
Experience the beauty of warm white LED lighting, printed by the opponent 2 of Japanese application No. 2020-210267 on Mar. 15, 2023, webpage <URL: https://www.lighting.phillips.com.my/consumer/led-lights/warm-led-light#slide_Flame_(2200K)>, Oct. 22, 2021, retrieved from Internet Archive <https://web.archive.org/20200901000000*https://www.lighting.phillips.com.my/consumer/led-lights/warm-led-light> on Jul. 6, 2023, published by Phillips.
White LED: How to make white light?, printed by the opponent 2 of Japanese application No. 2020-210267 on Mar. 13, 2023, webpage <URL: https://www.rohm.co.jp/electronics-basic/led/led_what3>, Jun. 22, 2019, retrieved from Internet Archive <https://web.archive.org/2019701000000 *https://www.www.rohm.co.jp/electronics-basic/led/led_what3> on Jul. 6, 2023, published by Phillips.
Haze Guuard i, printed by the opponent 2 of Japanese application No. 2020-210267 on Mar. 8, 2023, webpage <URL: https://www.tetsutani.co.jp.sokutei/hazeguard.html>, Aug. 12, 2020, retreived from Internet Archive <https://web.archive.org/web/20200901000000 *https://www.tetsutani.co.jp.sokutei/hazeguard.html> on Jul. 6, 2023, published by Tetsutani & Co., Ltd.
Color temperature exchange filter (LA, LB), printed by the opponent 2 of Japanese application No. 2020-210267 on Mar. 8, 2023, webpage <URL: https://www.hoyacandeo.co.jp.japanese/products/eo/color/06.html>, Oct. 14, 2018, retreived from Internet Archive <https://web.archive.org/web/20181101000000 *https://www.hoyacandeo.co.jp.japanese/products/eo/color/06.html> on Jul. 6, 2023, published by Hoya Group Optics Division.
IPC-TM-650 Test methods manual Apr. 2014, published by IPC International, Inc.
Examination Report of CN20202011494479.0 (dated Aug. 1, 2023).
Examination Report of CN20202011498748.0 (dated Aug. 5, 2023).
Notice of Allowance of U.S. Appl. No. 17/126,431 (dated Aug. 8, 2023).
Notice of Allowance of U.S. Appl. No. 17/126,446 (dated Aug. 23, 2023).
Notice of Allowance of CN202011494501.1 (dated Aug. 30, 2023).
Notice of Allowance of KR10-2020-0180090 (dated Aug. 31, 2023).
Ra changes when the cutoff changes, webpage <URL: https://michmet.com/ra_changes_when_the_cutoff_changes/>, Aug. 9, 2022, retrieved from Internet Archive < https://web.archive.org/web/20220815000000*/https://michmet.com/ra_changes_when_the_cutoff_changes/> on Sep. 8, 2023, published by Michmet Metrology, LLC.
Notice of Allowance of JP2020-210284 (dated Oct. 3, 2023).

(56) References Cited

OTHER PUBLICATIONS

Supplemental NOA of U.S. Appl. No. 17/126,431 (dated Oct. 4, 2023).
Notice of Allowance of JP2020-199487 (dated Oct. 10, 2023).

* cited by examiner

LAMINATE, CIRCUIT BOARD, AND LIQUID CRYSTAL POLYMER FILM APPLIED TO THE SAME

CROSS-REFERENCE TO RELATED APPLICATION

Pursuant to 35 U.S.C. § 119(e), this application claims the benefits of the priority to U.S. Provisional Patent Application No. 62/952,553, filed Dec. 23, 2019. The content of the prior application is incorporated herein by its entirety.

BACKGROUND OF THE INVENTION

1. Field of the Invention

The present application relates to a laminate, a circuit board, and a liquid crystal polymer (LCP) film comprised therein; more particularly, to a laminate, a circuit board, and an LCP film for electronic products which are suitable for transmitting signals in low-, medium-, and/or high-frequency bands.

2. Description of the Prior Arts

The rapid development of mobile communication technology has pushed the telecom industry to actively develop the fifth generation mobile networks, abbreviated as 5G, so as to optimize the performances, such as the data transmission rate, the response time, and the system capacity, etc. of the fourth generation mobile networks (4G).

In 5G communication technology, high-frequency bands are used for signal transmission. When the operating frequency of signals is higher, the degree of signal attenuation and the degree of signal distortion in transmission become more significant, and so does the insertion loss. Nevertheless, with the advancement of technology, the industry actively seeks better signal transmission capability of electronic products in high-frequency bands. Therefore, how to decrease or inhibit the insertion loss of circuit boards resulting from signal transmission in high-frequency bands has been one of the topics on which the industry is working.

In addition to improvement of signal transmission capability in high-frequency bands, the industry also actively seeks circuit boards with higher component density in order to decrease the size of low-, medium-, and/or high-frequency electronic products. However, the smaller the elements of electronic products, the more water absorption of circuit boards. That is, the quality and the performance of smaller electronic products are more susceptible to small amount of moisture and thus deteriorate during manufacture and usage. Further, for some outdoor electronic products, they may be exposed to a harsh environment (e.g. a high moisture environment) for a long time during usage, so the quality and the performance of electronic products can be influenced by moisture and thus be deteriorated. The insertion loss of electronic products becomes greater after water absorption, and thus, the electronic products are unable to perform excellent signal transmission capability in low-, medium-, and/or high-frequency bands as expected.

To overcome the shortcomings, the water absorption resistance of circuit boards in electronic products needs to be improved. After the improvement, the insertion loss of circuit boards in low-, medium-, and/or high-frequency bands will be inhibited or decreased, and the circuit boards will be suitable for low-, medium-, and/or high-frequency electronic products.

SUMMARY OF THE INVENTION

One of the objectives of the present application is to decrease and/or inhibit the insertion loss of a circuit board comprising a laminate during signal transmission in low-frequency band, medium-frequency band, and/or high-frequency band.

Another objective of the present application is to improve the moisture resistance of a circuit board comprising a laminate, so the circuit board is effectively resistant to the effects of a high moisture environment, thus decreasing the insertion loss of the circuit board during signal transmission in low-, medium-, and/or high-frequency bands before and after water absorption. To achieve the aforementioned objectives, the present application provides a laminate. The laminate comprises a metal foil and an LCP film, wherein the LCP film is disposed over the metal foil. The LCP film in the laminate has a dissipation factor before water absorption ($Df'_0$), a dissipation factor after water absorption ($Df'_1$), and a relative percentage difference between dissipation factors ($\Delta Df'$), which is calculated by the following equation:

$$\Delta Df'(\%) = \frac{|Df'_1 - Df'_0|}{Df'_0} \times 100\%,$$

wherein the $\Delta Df'$ is less than or equal to 16%, and the $Df'_0$ and the $Df'_1$ are respectively measured at 10 GHz before and after the LCP film in the laminate is soaked in pure water at 23° C. for 24 hours for water absorption.

By controlling the relative percentage difference between dissipation factors of the LCP film in the laminate, the insertion loss of a circuit board comprising a laminate during signal transmission in low-, medium-, and/or high-frequency bands can be decreased and/or inhibited. In addition, the difference between the insertion losses of the circuit board during signal transmission in various frequency bands before and after water absorption can be also decreased, so the circuit board is suitable for numerous electronic products.

In one of the embodiments, by improving the moisture resistance of the circuit board to withstand a high humidity environment, the circuit board of the present application is more suitable for outdoor electronic products such as those with a 5G antenna so as to have excellent signal transmission capability in high-frequency bands in a harsh environment (e.g. a high moisture environment).

The dissipation factor herein means signal dissipation in a material. Signal integrity can be improved by inhibiting and/or decreasing the degree of signal dissipation. The dissipation factor of a material is particularly susceptible to water absorption which happens when water penetrates into the material. The dissipation factor of water is about 40, which is much larger than the dissipation factor of materials commonly used, and thus water absorption significantly affects the dissipation factor of materials. In contrast to the general water absorption test in which only humidity of air is controlled, the dissipation factors of a material before and after water absorption are evaluated under an extremely harsh condition in the present specification the material is soaked in water for a long time so as to confirm that the material used in the present application surely can inhibit and/or decrease the insertion loss of a circuit board under an extremely harsh condition.

In one of the embodiments, $Df'_0$ and $Df'_1$ of the LCP film in the laminate of the present application may be from 0.0010 to 0.0030 and from 0.0011 to 0.0065, respectively. In another embodiment, $Df_0$ and $Df_1$ of the LCP film in the laminate of the present application may be from 0.0012 to 0.0020 and from 0.0013 to 0.0023, respectively. In yet another embodiment, $Df_0$ and $Df_1$ of the LCP film in the laminate of the present application may be from 0.0013 to 0.0015 and from 0.0015 to 0.0017, respectively. $Df_0$ and $Df_1$ of the LCP film in the laminate are measured in accordance with IPC-TM-650 2.5.5.13 after etching copper foils in the laminate. A person having ordinary knowledge in the art could understand: the lower the dissipation factor, the better the dielectric property; when the absolute difference between the dissipation factor of an LCP film in a laminate and that of the other LCP film in the other laminate is more than or equal to 0.0005, it means the LCP films in the laminates have significantly different dielectric properties.

In one of the embodiments, $\Delta Df$ of the LCP film in the laminate of the present application may be from 5% to 16%. In another embodiment, $\Delta Df$ of the LCP film in the laminate of the present application may be from 10% to 16%. In yet another embodiment, $\Delta Df$ of the LCP film in the laminate of the present application may be from 12% to 15.5%.

Optionally, the laminate of the present application has a peel strength before water absorption ($F_0$) and a peel strength after water absorption ($F_1$), wherein $F_0$ and $F_1$ are respectively measured before and after the laminate is soaked in pure water at 23° C. for 24 hours. In one of the embodiments, $F_0$ and $F_1$ of the laminate of the present application may both be from 0.85 kilonewtons/meter (kN/m) to 0.95 kN/m. In another embodiment, $F_0$ and $F_1$ of the laminate of the present application may both be from 0.90 kN/m to 0.95 kN/m. $F_0$ and $F_1$ of the laminate of the present application are measured in accordance with IPC-TM-650 2.4.9D in order to evaluate the peel strength between the LCP film and the metal foil in the laminate. The larger the peel strength, the stronger the peel strength between the LCP film and the metal foil in the laminate, indicating the LCP film and the metal foil are not separated from each other easily.

Optionally, a relative percentage difference between peel strengths ($\Delta F$) of the laminate of the present application may be calculated by the following equation:

$$\Delta F(\%) = \frac{|F_1 - F_0|}{F_0} \times 100\%.$$

In one of the embodiments, $\Delta F$ of the laminate of the present application may be less than or equal to 5%. In another embodiment, $\Delta F$ of the laminate of the present application may be from 0% to 2%. That is, the laminate of the present application has excellent moisture resistance. Preferably, the laminate of the present application passes a harsh heat resistance test before or after water absorption without bubbling or delamination. Optionally, hygroscopicity of the LCP film in the laminate of the present application may be less than or equal to 1%. In one of the embodiments, hygroscopicity of the LCP film in the laminate of the present application may be from 0% to 0.5%. In another embodiment, hygroscopicity of the LCP film in the laminate of the present application may be from 0.01% to 0.5%. In another embodiment, hygroscopicity of the LCP film in the laminate of the present application may be from 0.02% to 0.5%. In yet another embodiment, hygroscopicity of the LCP film in the laminate of the present application may be from 0.01% to 0.09%. In still yet another embodiment, hygroscopicity of the LCP film in the laminate of the present application may be from 0.01% to 0.05%. In yet still yet another embodiment, hygroscopicity of the LCP film in the laminate of the present application may be from 0.01% to 0.03%. In accordance with the present application, the thickness of the LCP film in the laminate is not particularly restricted. For example, the thickness of the LCP film may be more than or equal to 10 micrometers (μm) and less than or equal to 500 μm. In one of the embodiments, the thickness of the LCP film of the present application may be more than or equal to 10 μm and less than or equal to 300 μm. In another embodiment, the thickness of the LCP film of the present application may be more than or equal to 15 μm and less than or equal to 200 μm. In yet another embodiment, the thickness of the LCP film of the present application may be more than or equal to 20 μm and less than or equal to 200 μm. In still yet another embodiment, the thickness of the LCP film of the present application may be more than or equal to 50 μm and less than or equal to 200 μm.

In one of the embodiments, when the laminate of the present application comprises an LCP film with thickness of about 50 μm to 200 μm, the insertion loss of the circuit board comprising the laminate at the operating frequency of 1 GHz may be no more than −0.70 decibel (dB)/10 centimeters (cm). In addition, the insertion loss of the circuit board at 10 GHz may be no more than −3.50 dB/10 cm; the insertion loss of the circuit board at 20 GHz may be no more than −6.00 dB/10 cm; the insertion loss of the circuit board at 30 GHz may be no more than −8.50 dB/10 cm; and the insertion loss of the circuit board at 40 GHz may be no more than −13 dB/10 cm. The above-mentioned circuit board may comprise a laminate before water absorption and may comprise a laminate after water absorption. The insertion loss of the circuit board at different frequencies may be well controlled within the aforementioned ranges.

Optionally, the laminate may further comprise another metal foil, and the LCP film may be disposed between the metal foil (referred to as the first metal foil) and said another metal foil (referred to as the second metal foil). In accordance with the present application, the first metal foil and/or the second metal foil may be, but are not limited to, copper foil, gold foil, silver foil, nickel foil, aluminum foil, stainless steel foil, etc. In one of the embodiments, the first metal foil and the second metal foil are made of different materials. Preferably, the first metal foil and/or the second metal foil may be copper foil, so that the copper foil and the LCP film are stacked to form a copper clad laminate (CCL). In addition, the manufacturing methods of the first metal foil and/or that of the second metal foil are not particularly restricted, as long as the methods do not violate the objective of the present application. For example, the metal foil may be produced by, but not limited to, a roll-to-roll method or an electrodeposition method.

In accordance with the present application, the LCP film in the laminate may be stacked to a metal foil and be disposed over the metal foil. "Stacking" is not limited to stacking in a direct contact manner, but also comprises stacking in an indirect contact manner. For example, in one of the embodiments of the present application, the first metal foil is stacked to the first surface of the LCP film in a direct contact manner in the laminate. In another embodiment of the present application, the first metal foil is stacked to the first surface of the LCP film in an indirect contact manner in the laminate; more specifically, a connection layer may be disposed between the first metal foil and the first surface of the LCP film based on different needs, so that the first metal foil contacts the first surface of the LCP film via the connection layer. The material of the connection layer may be adjusted according to different needs. For example, the material of the connection layer may include nickel, cobalt, chromium, or alloys thereof to provide functions such as thermal resistance, chemical resistance, or electrical resistance. Similarly, the second metal foil and the LCP film in the laminate may also be stacked with each other in a direct contact manner or in an indirect contact manner. In one of the embodiments, the stacking manner for the LCP film and the first metal foil and that for the LCP film and the second metal foil may be the same or different.

In accordance with the present application, the thickness of the first metal foil and/or the second metal foil is not particularly restricted and can be adjusted based on different needs by a person having ordinary knowledge in the art. For example, in one of the embodiments, the thickness of the first metal foil and/or the second metal foil may independently be more than or equal to 1 µm and less than or equal to 200 µm; preferably, the thickness of the first metal foil and/or the second metal foil may independently be more than or equal to 1 µm and less than or equal to 40 µm; more preferably, the thickness of the first metal foil and/or the second metal foil may independently be more than or equal to 1 µm and less than or equal to 20 µm; even more preferably, the thickness of the first metal foil and/or the second metal foil may independently be more than or equal to 3 µm and less than or equal to 20 µm.

In accordance with the present application, surface treatments of the first metal foil and/or the second metal foil of the present application can be conducted based on different needs by a person having ordinary knowledge in the art. For example, the surface treatments may be selected from, but not limited to, roughening treatments, acid-base treatments, thermal treatments, degreasing treatments, ultraviolet irradiation treatments, corona discharge treatments, plasma treatments, primer coating treatments, etc.

In accordance with the present application, the roughness of the first metal foil and/or the second metal foil is not particularly restricted and can be adjusted according to different needs by a person having ordinary knowledge in the art. In one of the embodiments, the ten-point mean roughness (Rz) of the first metal foil and/or Rz of the second metal foil may independently be more than or equal to 0.1 µm and less than or equal to 2.0 µm; preferably, Rz of the first metal foil and/or Rz of the second metal foil may independently be more than or equal to 0.1 µm and less than or equal to 1.5 µm. In one of the embodiments, Rz of the first metal foil and Rz of the second metal foil may both fall within the aforementioned ranges. Rz of the first metal foil and Rz of the second metal foil may be the same or different based on needs. In one of the embodiments, Rz of the first metal foil and Rz of the second metal foil are different.

In one of the embodiments, a third metal foil may be additionally provided based on different needs by a person having ordinary knowledge in the art, wherein the third metal is disposed over the LCP film. The third metal foil may be the same as or different from the first metal foil and/or the second metal foil based on needs. In one of the embodiments, Rz of the third metal foil may fall within the aforementioned ranges of Rz of the first metal foil and/or Rz of the second metal foil. In one of the embodiments, Rz of the first metal foil, Rz of the second metal foil, and Rz of the third metal foil are different.

Preferably, the first, second, and/or third metal foils may be metal foils with low roughness, e.g. copper foils with low roughness.

In one of the embodiments, the laminate may comprise multiple LCP films. Based on the premise of not violating the spirit of the present application, multiple LCP films of the present application and multiple metal foils, such as the aforesaid first, second, and/or third metal foils, may be stacked based on different needs to produce a laminate having the multiple LCP films and the multiple metal foils by a person having ordinary knowledge in the art.

In addition to controlling the aforementioned dielectric properties of the LCP film in the laminate, controlling dielectric properties of the LCP film itself is also conducted in the present application. The LCP film (raw film) has a dissipation factor before water absorption ($Df_0$), a dissipation factor after water absorption ($Df_1$), and a relative percentage difference between dissipation factors ($\Delta Df$), which is calculated by the following equation:

$$\Delta Df(\%) = \frac{|Df_1 - Df_0|}{Df_0} \times 100\%,$$

wherein $\Delta Df$ is less than or equal to 16%, and $Df_0$ and $Df_1$ are respectively measured at 10 GHz before and after the LCP film is soaked in pure water at 23° C. for 24 hours for water absorption.

In one of the embodiments, $Df_0$ of the LCP film of the present application may be from 0.0010 to 0.0030, and $Df_1$ of the LCP film of the present application may be from 0.0011 to 0.0065. In another embodiment, $Df_0$ of the LCP film of the present application may be from 0.0012 to 0.0020, and $Df_1$ of the LCP film of the present application may be from 0.0013 to 0.0023. In yet another embodiment, $Df_0$ of the LCP film of the present application may be from 0.0013 to 0.0015, and $Df_1$ of the LCP film of the present application may be from 0.0015 to 0.0017. $Df_0$ and $Df_1$ of the LCP film (raw film) are measured in accordance with IPC-TM-650 2.5.5.13. As mentioned above, a person having ordinary knowledge in the art could understand: the lower the dissipation factor, the better the dielectric property; when the absolute difference between the dissipation factor of an LCP film (raw film) and that of the other LCP film (raw film) is more than or equal to 0.0005, it means the two LCP films (raw films) have significantly different dielectric properties.

Preferably, $\Delta Df$ of the LCP film of the present application is less than or equal to 15%. In one of the embodiments, $\Delta Df$ of the LCP film of the present application may be from 5% to 16%. In another embodiment, $\Delta Df$ of the LCP film of the present application may be from 5% to 15%. In yet another embodiment, $\Delta Df$ of the LCP film of the present application may be from 6.5% to 14.5%.

In accordance with the present application, the LCP film may be produced by an LCP resin, which is commercially available or made from conventional raw materials. In the present application, the LCP resin is not particularly restricted. For example, aromatic or aliphatic hydroxy compounds such as hydroquinone, resorcin, 2,6-naphthalenediol, ethanediol, 1,4-butanediol, and 1,6-hexanediol; aromatic or aliphatic dicarboxylic acids such as terephthalic acid, isophthalic acid, 2,6-naphthalenedicarboxylic acid, 2-chloroterephthalic acid, and adipic acid; aromatic hydroxy carboxylic acids such as 3-hydroxybenzoic acid, 4-hydroxybenzoic acid, 6-hydroxy-2-naphthalenecarboxylic acid, and 4'-hydroxy-4-biphenylcarboxylic acid; aromatic amine compounds such as p-phenylenediamine, 4,4'-diaminobiphenyl, naphthalene-2,6-diamine, 4-aminophenol, 4-amino-3-methylphenol, and 4-aminobenzoic acid may be used as raw materials to prepare the LCP resin, and the LCP resin is then used to prepare the LCP film of the present application. In one of the embodiments, 6-hydroxy-2-naphthalenecarboxylic acid, 4-hydroxybenzoic acid, acetyl anhydride (also called acetic anhydride), or any of derivatives of 6-hydroxy-2-naphthalenecarboxylic acid and 4-hydroxybenzoic acid may be chosen to obtain the LCP resin, which can be used to prepare the LCP film of the present application.

In one of the embodiments, a person having ordinary knowledge in the art may add additives such as, but not limited to, lubricants, antioxidants, electrical insulating agents, or fillers during preparation of the LCP film of the present application based on different needs. For example, the applicable additives may be, but are not limited to, polycarbonate, polyamide, polyphenylene sulfide, polyetheretherketone, etc.

In another aspect, the present application provides a circuit board comprising the foresaid LCP film. As stated above, by adopting the LCP film of the present application, the insertion loss of the circuit board during signal transmission in low-, medium-, and/or high-frequency bands can be inhibited and/or decreased even under an extremely harsh condition.

Other objectives, advantages and novel features of the invention will become more apparent from the following detailed description when taken in conjunction with the accompanying drawings.

DETAILED DESCRIPTION OF THE PREFERRED EMBODIMENTS

Hereinafter, multiple preparation examples are provided to illustrate raw materials used to produce the LCP film of the present application. Multiple examples are further provided to illustrate the implementation of the LCP film and the laminate of the present application, while multiple comparative examples are provided as comparison. A person having ordinary knowledge in the art can easily realize the advantages and effects of the present application from the following examples and comparative examples. The descriptions proposed herein are just preferable embodiments for the purpose of illustrations only, not intended to limit the scope of the present application. Various modifications and variations could be made in order to practice or apply the present application without departing from the spirit and scope of the present application.

<<LCPResin>>

Preparation Example 1: LCP Resin

A mixture of 6-hydroxy-2-naphthalenecarboxylic acid (540 g), 4-hydroxybenzoic acid (1071 g), acetyl anhydride (1086 g), sodium phosphite (1.3 g), and 1-methylimidazole (0.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour. Under this temperature condition, the pressure was reduced slowly from 760 torr to 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point of about 278° C. and a viscosity of about 45 pascal-seconds (Pa·s) measured at 300° C. (hereinafter referred to as @300° C.).

Preparation Example 2: LCP Resin

A mixture of 6-hydroxy-2-naphthalenecarboxylic acid (440 g), 4-hydroxybenzoic acid (1145 g), acetyl anhydride (1085 g), and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour. Under this temperature condition, the pressure was reduced slowly from 760 torr to 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point of about 305° C. and a viscosity of about 40 Pa·s @320° C.

<<LCP Films>>

Example 1: LCP Film

The LCP resin obtained from Preparation Example 1 was put into an extruder having a screw diameter of 27 millimeters (mm) (manufacturer: Leistritz, model: ZSE27) and heated to a temperature ranging from 300° C. to 320° C., and then extruded from a T-die of a width of 500 mm at a feeding speed of 5.5 kilograms per hour (kg/hr). The LCP resin was then delivered to a space between two casting wheels having a temperature of about 300° C. and a diameter ranging from about 35 cm to 45 cm, extruded with a force of about 20 kilonewtons (kN) to 60 kN, and then transferred to a cooling wheel for cooling at room temperature to obtain an LCP film having a thickness of about 50 μm. Herein, the casting wheels were spaced about 20 mm from the T-die.

Example 2: LCP Film

The LCP resin obtained from Preparation Example 2 was put into an extruder having a screw diameter of 27 mm (manufacturer: Leistritz, model: ZSE27) and heated to a temperature ranging from 300° C. to 320° C., and then extruded from a T-die of a width of 500 mm at a feeding speed of 7.5 kg/hr. The LCP resin was then delivered to a space between two casting wheels having a temperature of about 310° C. and a diameter ranging from about 35 cm to 45 cm, extruded with a force of about 20 kN to 60 kN, and then transferred to a cooling wheel for cooling at room temperature to obtain an LCP film having a thickness of about 50 μm. Herein, the casting wheels were spaced about 20 mm from the T-die.

Example 3: LCP Film

The LCP resin obtained from Preparation Example 1 was put into an extruder having a screw diameter of 27 mm (manufacturer: Leistritz, model: ZSE27) and heated to a temperature ranging from 300° C. to 320° C., and then extruded from a T-die of a width of 500 mm at a feeding speed of 6.5 kg/hr. The LCP resin was then delivered to a space between two casting wheels having a temperature of about 305° C. and a diameter ranging from about 35 cm to 45 cm, extruded with a force of about 20 kN to 60 kN, and then transferred to a cooling wheel for cooling at room temperature to obtain an LCP film having a thickness of about 200 μm. Herein, the casting wheels were spaced about 20 mm from the T-die.

The above-mentioned preparation method of LCP film is only used to exemplify implementation of the present application. A person having ordinary knowledge in the art may also use conventional methods such as a laminate extension method, an inflation method, and a solvent casting method to prepare an LCP film.

In one of the embodiments, after the LCP resin was extruded from the T-die, the LCP resin might be delivered with two high-temperature resistant films to a space between two casting wheels to form a laminated structure with three layers based on needs by a person having ordinary knowledge in the art. The two high-temperature resistant films were detached from the LCP resin at room temperature so as to obtain the LCP film of the present application. It is understood that the diameter of the casting wheels is not particularly restricted. The high-temperature resistant film may be selected from, but not limited to, poly(tetrafluoroethene) (PTFE) film, polyimide (PI) film, and poly(ether sulfone) (PES) film.

In addition, post treatments for the obtained LCP film may be conducted based on different needs by a person having ordinary knowledge in the art. The post treatments may be, but are not limited to, polishing, ultraviolet irradiation, heating, plasma treatment, etc. Taking the plasma treatment as an example, it may be applied with a plasma operated with a power of 1 kW under nitrogen, oxygen, or air atmosphere at a reduced or normal pressure (1 atm) by a person having ordinary knowledge in the art based on different needs but is not limited thereto.

Comparative Example 1: Commercial Polymer Film

Comparative Example 1 was a commercial polymer film, which was purchased from Kaneka Corporation; model: PIXEO BP FRS-282 #SW; thickness: about 50 μm.

Comparative Example 2: Commercial Polymer Film

Comparative Example 2 was a commercial polymer film, which was purchased from Ube Industries, Ltd.; model: UPILEX-50NVT; thickness: about 50 μm.

<<Laminates>>

Examples 1A to 3A and Comparative Examples 1A and 2A: Laminates

Laminates of Examples 1A to 3A and Comparative Examples 1A and 2A were produced by respectively sandwiching the LCP films of Examples 1 to 3 and the commercial polymer films of Comparative Examples 1 and 2 between two identical commercial copper foils.

Specifically, the above-mentioned polymeric films (referring to the LCP films of Examples 1 to 3 and the commercial polymer films of Comparative Examples 1 and 2) and the two identical commercial copper foils (model: CF-H9A-HD2, purchased from FUKUDA METAL FOIL & POWDER CO., LTD., Rz: about 1.0 μm) were each first cut to size of 20 cm×20 cm. Each of the polymeric films was then sandwiched between the two commercial copper foils to form a laminated structure. The laminated structure was subjected to a lamination process with a pressure of 5 kilograms per square centimeter (kg/cm²) for 60 seconds at 180° C., followed by another lamination process with a pressure of 20 kg/cm² for 25 minutes (min) at 300° C., and then cooled down to room temperature to obtain a laminate.

Each of the laminates of Examples 1A to 3A comprised two commercial copper foils—each with thickness of about 12 μm—and an LCP film, which was sandwiched between the two commercial copper foils. The laminates of Examples 1A to 3A contained the LCP film with thickness of 50 μm of Example 1, the LCP film with thickness of 50 μm of Example 2, and the LCP film with thickness of 200 μm of Example 3, respectively. Each of the laminates of Comparative Examples 1A and 2A comprised two commercial copper foils—each with thickness of about 12 μm—and a commercial polymer film, which was sandwiched between the two commercial copper foils. The laminates of Comparative Examples 1A and 2A contained the commercial polymer film with thickness of 50 μm of Comparative Example 1, and the commercial polymer film with thickness of 50 μm of Comparative Example 2, respectively.

It is understood that the lamination method for the laminates is not particularly restricted. A person having ordinary knowledge in the art may use conventional techniques such as a wire lamination or a surface lamination to conduct the lamination process. A laminator applicable to the present application may be, but is not limited to, an intermittent hot-press machine, a roll-to-roll wheeling machine, a double belt press machine, etc. According to different needs, a person having ordinary knowledge in the art can also align the LCP film with the copper foils to form a laminated structure, which may then be processed with surface lamination comprising a heating step and a pressing step.

In another embodiment, a metal foil, such as a copper foil, on an LCP film may be formed through sputtering, electroplating, chemical plating, evaporation deposition, etc. based on different needs by a person having ordinary knowledge in the art. Or, a connection layer, such as a glue layer, a nickel layer, a cobalt layer, a chromium layer, or an alloy layer thereof, may be formed between an LCP film and a metal foil based on different needs by a person having ordinary knowledge in the art.

Test Example 1: Dielectric Property Analysis of Polymeric Films

In this test example, the LCP films of Examples 1 to 3 and the commercial polymer films of Comparative Examples 1 and 2 were used as test samples. The dissipation factors before and after water absorption of the test samples were measured at 10 GHz by a microwave network analyzer with resonance cavity (model: ZNB20, purchased from ROHDE & SCHWARZ) in accordance with IPC-TM-650 2.5.5.13.

The dissipation factor before water absorption ($Df_0$) of each test sample was measured as follows. The test samples were each heated in an oven at 105° C. to 110° C. for 1 hour and then dried in a desiccator to cool down to the room temperature. After that, the dissipation factor before water absorption ($Df_0$) of each test sample was measured according to the above-mentioned method. Further, the dissipation factor after water absorption ($Df_1$) of each test sample was measured as follows. In accordance with IPC-TM-650 2.6.2.1A, the test samples were soaked in pure water at 23° C. for 24 hours. Then, the test samples were dried with a dry cloth until no water remained on their surfaces. At last, the dissipation factor after water absorption ($Df_1$) of each test example was measured according to the above-mentioned method. The experimental results are shown in Table 1 below.

In addition, in order to analyze the relative percentage difference between dissipation factors before and after water absorption of the test samples, the following equation is used to evaluate the relative percentage difference between dissipation factors ($\Delta Df$) of the test samples, wherein the unit of $\Delta Df$ is percent (%). As indicated in the following equation, since the absolute value symbols are used for the difference between $Df_1$ and $Df_0$, the relative percentage difference between dissipation factors of the polymeric films is shown as a positive percent value.

$$\Delta Df(\%) = \frac{|Df_1 - Df_0|}{Df_0} \times 100\%$$

TABLE 1

Dissipation factors before and after water absorption of LCP films of Examples 1 to 3 and commercial polymer films of Comparative Examples 1 and 2 measured at 10 GHz.

|  | Dissipation Factors | | |
| --- | --- | --- | --- |
|  | $Df_0$ | $Df_1$ | $\Delta Df$ |
| Example 1 | 0.0015 | 0.0017 | 13.33% |
| Example 2 | 0.0015 | 0.0016 | 6.67% |
| Example 3 | 0.0014 | 0.0016 | 14.29% |
| Comparative Example 1 | 0.0077 | 0.0234 | 203.90% |
| Comparative Example 2 | 0.0047 | 0.0151 | 221.28% |

From Table 1, it is clear that $\Delta Df$ of the LCP films (raw films) of Examples 1 to 3 is less than 16%. Specifically, $\Delta Df$ of the LCP films of Examples 1 to 3 falls within the range of 5% to 16%, indicating each of the LCP films of Examples 1 to 3 maintains excellent dissipation factor after water absorption. In contrast, $\Delta Df$ of the commercial polymer films of Comparative Examples 1 and 2 is more than 200%.

As indicated in Table 1, for the dissipation factor before water absorption ($Df_0$), $Df_0$ of the LCP films of Examples 1 to 3 is from 0.0014 to 0.0015, which is significantly smaller than $Df_0$ of the commercial polymer films of Comparative Examples 1 and 2. In other embodiments, $Df_0$ of the LCP film of the present application may be from 0.0010 to 0.0030. In addition, for the dissipation factor after water absorption ($Df_1$), $Df_1$ of the LCP films of Examples 1 to 3 is from 0.0016 to 0.0017, which is significantly smaller than $Df_1$ of the commercial polymer films of Comparative Examples 1 and 2. In other embodiments, $Df_1$ of the LCP film of the present application may be from 0.0011 to 0.0065.

Test Example 2: Dielectric Property Analysis of the Polymeric Film in the Laminate In this test example, each of the laminates of Examples 1A to 3A and Comparative Examples 1A and 2A was etched with etchant first in order to remove the two commercial copper foils and obtain the polymeric film therein, wherein the etchant was acidic cupric chloride etching solution with the concentration of copper ions of about 150 grams/liter (g/L) to 240 g/L and the normality (N) of hydrochloric acid of about 0.04 N to 0.3 N. The polymeric films were washed with pure water for several times to remove the etchant so as to be used as test samples. The dissipation factors before and after water absorption of the test samples were measured at 10 GHz by microwave network analyzer with resonance cavity (model: ZNB20, purchased from ROHDE & SCHWARZ) in accordance with IPC-TM-650 2.5.5.13.

The dissipation factor before water absorption ($Df'_0$) of each test sample was measured as follows. The test samples were each heated in an oven at 105° C. to 110° C. for 1 hour and then dried in a desiccator to cool down to the room temperature. After that, the dissipation factor before water absorption ($Df'_0$) of each test sample was measured according to the above-mentioned method. Further, the dissipation factor after water absorption ($Df'_1$) of each test sample was measured as follows. In accordance with IPC-TM-650 2.6.2.1A, the test samples were soaked in pure water at 23° C. for 24 hours. Then, the test samples were dried with a dry cloth until no water remained on their surfaces. At last, the dissipation factor after water absorption ($Df'_1$) of each test example was measured according to the above-mentioned method. The experimental results are shown in Table 2 below.

In addition, in order to analyze the relative percentage difference between dissipation factors before and after water absorption of the test samples, the following equation is used to evaluate the relative percentage difference between dissipation factors ($\Delta Df'$) of the test samples, wherein the unit of $\Delta Df'$ is percent (%). As indicated in the following equation, since the absolute value symbols are used for the difference between $Df'_1$ and $Df'_0$, the relative percentage difference between dissipation factors of the polymeric film in each of the laminates is shown as a positive percent value.

$$\Delta Df'(\%) = \frac{|Df'_1 - Df'_0|}{Df'_0} \times 100\%$$

From the preparation of the test samples, it is understood that the dissipation factors before and after water absorption measured for each test sample indicate the dissipation factors before and after water absorption of the polymeric film in each of the laminates of Examples 1A to 3A and Comparative Examples 1A and 2A. That is, in Table 2, $Df'_0$, $Df'_1$, and $\Delta Df'$ of each of Examples 1A to 3A refer to $Df'_0$, $Df'_1$, and $\Delta Df'$ of the LCP film in each of the laminates of Examples 1A to 3A; $Df'_0$, $Df'_1$, and $\Delta Df'$ of each of Comparative Examples 1A and 2A refer to $Df'_0$, $Df'_1$, and $\Delta Df'$ of the commercial polymer film in each of the laminates of Comparative Examples 1A and 2A.

TABLE 2

Dissipation factors before and after water absorption of LCP films in laminates of Examples 1A to 3A and commercial polymer films in laminates of Comparative Examples 1A and 2A measured at 10 GHz.

| | Dissipation Factors | | |
|---|---|---|---|
| | $Df_0$ | $Df_1$ | $\Delta Df$ |
| Example 1A | 0.0014 | 0.0016 | 14.3% |
| Example 2A | 0.0015 | 0.0017 | 13.3% |
| Example 3A | 0.0013 | 0.0015 | 15.4% |
| Comparative Example 1A | 0.0074 | 0.0212 | 186.5% |
| Comparative Example 2A | 0.0044 | 0.0143 | 225.0% |

As indicated in Table 2, $\Delta Df$ of the LCP film in each of the laminates of Examples 1A to 3A is less than 16%. Specifically, $\Delta Df$ of the LCP film in each of the laminates of Examples 1A to 3A falls within the range of 5% to 16%, indicating the LCP film in each of the laminates of Examples 1A to 3A maintains excellent dissipation factor after water absorption. In contrast, $\Delta Df$ of the commercial polymer film in each of the laminates of Comparative Examples 1A and 2A is more than 185% and even up to 225%, indicating the commercial polymer film in each of the laminates of Comparative Examples 1A and 2A is susceptible to a high moisture environment. As a result, the dielectric property of the dissipation factor after water absorption of each of the commercial polymer films of Comparative Examples 1A and 2A is obviously deteriorated.

As indicated in Table 2, for the dissipation factor before water absorption ($Df_0$), $Df_0$ of the LCP film in each of the laminates of Examples 1A to 3A is from 0.0013 to 0.0015, which is significantly smaller than $Df_0$ of the commercial polymer film in each of the laminates of Comparative Examples 1A and 2A. In other embodiments, $Df_0$ of the LCP film in the laminate of the present application may be from 0.0010 to 0.0030. In addition, for the dissipation factor after water absorption ($Df_1$), $Df_1$ of the LCP film in each of the laminates of Examples 1A to 3A is from 0.0015 to 0.0017, which is also significantly smaller than $Df_1$ of the commercial polymer film in each of the laminates of Comparative Examples 1A and 2A. In other embodiments, $Df_1$ of the LCP film in the laminate of the present application may be from 0.0011 to 0.0065.

Test Example 3: Peel Strength Analysis of Laminates

In this test example, the laminates of Examples 1A to 3A were used as test samples. Peel strength before and after water absorption of the test samples was measured in accordance with IPC-TM-650 2.4.9D. Each of the test samples was first cut into an etched specimen with a length of about 228.6 mm and a width of about 3.2 mm, wherein the etched specimen was the type A etched specimen in IPC-TM-650 2.4.9D. The etched specimens were then placed at a temperature of 23±2° C. and a relative humidity of 50±5% for 24 hours to be stabilized. After that, each of the etched specimens was adhered to the fixture of a testing machine (manufacturer: Hung Ta Instrument Co., Ltd.; model: HT-9102) with a double-sided tape. The etched specimen on the fixture was peeled off at a peeling speed of 50.8 mm/min, and the peel strength during the peeling process was continuously recorded. Herein, the peel strength should be controlled within the range of 15% to 85% of the maximal peel strength that the test machine was able to withstand; the peeling distance should be at least more than 57.2 mm, and the peel strength of the initial peeling distance of 6.4 mm was neglected.

In this test example, the etched specimen for measuring the peel strength before water absorption was directly prepared from the laminates of Examples 1A to 3A in accordance with IPC-TM-650 2.4.9D, whereas the etched specimen for measuring the peel strength after water absorption was prepared from the laminates of Examples 1A to 3A by first soaking the laminates in pure water at 23° C. for 24 hours, drying the laminates with a dry cloth until no water remained on the surfaces, and then preparing in accordance with IPC-TM-650 2.4.9D.

The peel strength before water absorption ($F_0$) and the peel strength after water absorption ($F_1$) of each of the laminates of Examples 1A to 3A are shown in Table 3 below. Further, in order to analyze the relative percentage difference between peel strengths before and after water absorption of the test samples, the following equation is used to evaluate the relative percentage difference between peel strengths ($\Delta F$) of the test samples, wherein the unit of $\Delta F$ is percent (%). As indicated in the following equation, since the absolute value symbols are used for the difference between $F_1$ and $F_0$, the relative percentage difference between peel strengths of the laminates is shown as a positive percent value.

$$\Delta F(\%) = \frac{|F_1 - F_0|}{F_0} \times 100\%$$

TABLE 3

Peel strengths before and after water absorption of laminates of Examples 1A to 3A.

| | $F_0$ (kN/m) | $F_1$ (kN/m) | $\Delta F$ (%) |
|---|---|---|---|
| Example 1A | 0.91 | 0.92 | 1.1% |
| Example 2A | 0.90 | 0.91 | 1.1% |
| Example 3A | 0.91 | 0.91 | 0% |

As indicated in Table 3, $F_0$ of each of the laminates of Examples 1A to 3A is from 0.90 kN/m to 0.91 kN/m, whereas $F_1$ of each of the laminates of Examples 1A to 3A is from 0.91 kN/m to 0.92 kN/m. $F_0$ and $F_1$ of each of the laminates of Examples 1A to 3A are similar, and $\Delta F$ is less than 2%. In particular, $\Delta F$ of the laminate of Example 3A is 0%, which is better than the other two examples. In other embodiments, $F_0$ of the laminate of the present application may be from 0.85 kN/m to 0.95 kN/m, and $F_1$ of the laminate of the present application may also be from 0.85 kN/m to 0.95 kN/m. In addition, $\Delta F$ of the laminate of the present application may be less than or equal to 5%; specifically, $\Delta F$ of the laminate of the present application may be from 0% to 2%.

Test Example 4: Hygroscopicity Analysis of the Polymeric Film in the Laminate

This test example was conducted in accordance with IPC-TM-650 2.6.2.1A. Each of the laminates of Examples 1A to 3A and Comparative Examples 1A and 2A was etched with etchant first in order to remove the two commercial copper foils and obtain the polymeric film therein, wherein the etchant was acidic cupric chloride etching solution with the concentration of copper ions of about 150 g/L to 240 g/L and the normality (N) of hydrochloric acid of about 0.04 N to 0.3 N. The polymeric film was then cut into an etched specimen with a length of about 2.0 inches and a width of about 2.0 inches. After that, the etched specimen was dried at 105° C. to 110° C. for 1 hour, cooled to room temperature, and weighed as a dry weight ($W_0$). Then, the etched specimen was soaked in pure water at 23±1.1° C. for 24 hours, dried with a dry cloth until no water remained on the surfaces, and weighed as a wet weight ($W_1$). Hygroscopicity (ΔW) of the polymeric film of each of the laminates is calculated by the following equation, and the unit of ΔW is percent (%). The experimental results are shown in Table 4 below.

$$\Delta W(\%) = \frac{W_1 - W_0}{W_0} \times 100\%$$

As indicated in Table 4, hygroscopicity of the LCP film in each of the laminates of Examples 1A to 3A is merely 0.02% to 0.03%, which is significantly lower than hygroscopicity of the laminates of Comparative Examples 1A and 2A (1.28% and 1.49%). In some of the embodiments, hygroscopicity of the LCP film in the laminate of the present application may be less than or equal to 1%. In other embodiments, hygroscopicity of the LCP film in the laminate of the present application may be from 0.01% to 0.5%.

Test Example 5: Heat Resistance Analysis of Laminates

In this test example, the laminates of Examples 1A to 3A and Comparative Examples 1A and 2A were used as test samples and processed in accordance with IPC-TM-650 2.4.13F before and after water absorption. Each of the test samples was first cut to size of about 50 mm×50 mm. Soldering flux was applied to one of the metal foils in the test samples, and then the test samples were baked at 135±10° C. for 1 hour and cooled to room temperature. After that, the test samples were subjected to a heat resistance test at 288±5° C. for 10 seconds to observe whether bubbling or delamination occurred on the surfaces of the LCP films in the laminates of Examples 1A to 3A and the commercial polymer films in the laminates of Comparative Examples 1A and 2A.

As mentioned above, the laminates were soaked in pure water at 23° C. for 24 hours for water absorption and then dried with a dry cloth until no water remained on the surfaces.

Each of the test samples was evaluated whether bubbling or delamination occurred after the test samples were subjected to a heat resistance test before and after water absorption. If neither bubbling nor deamination was observed, "passed" was indicated in Table 4 below; however, if any bubbling or deamination was observed, "failed" was indicated in Table 4 below.

Table 4: Hygroscopicity before and after water absorption of polymeric films of laminates of Examples 1A to 3A and Comparative Examples 1A and 2A as well as heat resistance before and after water absorption of laminates of Examples 1A to 3A and Comparative Examples 1A and 2A.

|  | Hygroscopicity | Heat resistance before water absorption | Heat resistance after water absorption |
|---|---|---|---|
| Example 1A | 0.03% | passed | Passed |
| Example 2A | 0.02% | passed | passed |
| Example 3A | 0.02% | passed | passed |
| Comparative Example 1A | 1.28% | passed | failed |
| Comparative Example 2A | 1.49% | passed | failed |

As indicated in Table 4 (showing the experimental results of Test Examples 4 and 5), since hygroscopicity of the LCP films in the laminates of Examples 1A to 3A was significantly lower than that of the commercial polymer films in the laminates of Comparative Examples 1A and 2A, neither bubbling nor delamination occurred in the laminates of Examples 1A to 3A after water absorption. Therefore, the laminates of Examples 1A to 3A passed the heat resistance test. In contrast, hygroscopicity of the LCP films in the laminates of Comparative Examples 1A and 2A was much higher, so bubbling and delamination occurred in the laminates after water absorption and baking at a high temperature of 288° C. Therefore, the laminates of Comparative Examples 1A and 2A failed the heat resistance test.

Test Example 6: Insertion Loss Analysis of a Circuit Board Comprising a Laminate In this test example, the laminates of Examples 1A to 3A and Comparative Examples 1A and 2A were processed in accordance with IPC-TM-650 2.5.5.7A before and after water absorption. That is, one side of each of the laminates was etched to form a strip line with a length of about 100 mm, a width of about 100 μm, to 250 μm, and impedance of about 50 ohms (Ω)±10 Ω, while the other side of each of the laminates was fully covered with a copper foil as a grounding wire to obtain circuit boards (which were used as test samples of this test example), wherein the width of the strip line could be adjusted based on the dielectric properties and thickness of the laminate. Subsequently, the insertion loss of each of the test samples was measured at 1 GHz to 40 GHz by a microwave network analyzer (model: 8722ES, purchased from Agilent Technology) and a probe (model: ACP40-250, purchased from Cascade Microtech).

As mentioned above, the laminates were soaked in pure water at 23° C. for 24 hours for water absorption and then dried with a dry cloth until no water remained on the surfaces. The insertion loss before water absorption ($I_0$) and the insertion loss after water absorption ($I_1$) of test samples, which were measured at different frequencies according to the above-mentioned method, were shown in Table 5 below. In addition, in order to analyze the relative percentage difference between insertion losses before and after water absorption of the circuit boards, the following equation is used to calculate the relative percentage difference between insertion losses (ΔI) of the circuit boards, wherein the unit of ΔI is percent (%). As indicated in the following equation, since the absolute value symbols are used for the difference between $I_1$ and $I_0$, the relative percentage difference between insertion losses of the circuit boards is shown as a positive percent value. The experimental results are shown in Table 5.

$$\Delta I(\%) = \frac{|I_1 - I_0|}{I_0} \times 100\%$$

TABLE 5

$I_0$, $I_1$, and $\Delta I$ of circuit boards measured at 1 GHz to 40 GHz, wherein each of the circuit boards comprises one of the laminates of Examples 1A to 3A and Comparative Examples 1A and 2A.

| | | Insertion Loss (dB/10 cm) | | | | |
|---|---|---|---|---|---|---|
| | | 1 GHz | 10 GHz | 20 GHz | 30 GHz | 40 GHz |
| Example 1A | $I_0$ | −0.64 | −2.84 | −4.83 | −6.47 | −8.98 |
| | $I_1$ | −0.66 | −2.88 | −4.95 | −6.96 | −9.44 |
| | $\Delta I$ | 3.13% | 1.41% | 2.48% | 7.57% | 5.12% |
| Example 2A | $I_0$ | −0.65 | −2.86 | −4.86 | −6.51 | −9.03 |
| | $I_1$ | −0.67 | −2.9 | −4.98 | −6.99 | −9.44 |
| | $\Delta I$ | 3.08% | 1.40% | 2.47% | 7.37% | 4.54% |
| Example 3A | $I_0$ | −0.31 | −1.72 | −2.83 | −4.16 | −5.46 |
| | $I_1$ | −0.32 | −1.76 | −2.92 | −4.43 | −5.7 |
| | $\Delta I$ | 3.23% | 2.33% | 3.18% | 6.49% | 4.40% |
| Comparative Example 1A | $I_0$ | −0.77 | −3.89 | −6.77 | −9.64 | −14.95 |
| | $I_1$ | −0.93 | −6.46 | −11.56 | −17.77 | −24.38 |
| | $\Delta I$ | 20.78% | 66.07% | 70.75% | 84.34% | 63.08% |
| Comparative Example 2A | $I_0$ | −0.85 | −3.56 | −6.07 | −8.57 | −13.5 |
| | $I_1$ | −0.92 | −5.62 | −10.31 | −15.33 | −21.87 |
| | $\Delta I$ | 8.24% | 57.87% | 69.85% | 78.88% | 62.00% |

As indicated in Table 5, for the insertion loss before water absorption ($I_0$), $I_0$ of the circuit boards, each of which comprised one of the laminates of Examples 1A to 3A, measured at 1 GHz to 40 GHz is significantly lower than $I_0$ of circuit boards, each of which comprised one of the laminates of Comparative Examples 1A and 2A, measured at 1 GHz to 40 GHz. For the insertion loss after water absorption ($I_1$), $I_1$ of circuit boards, each of which comprised one of the laminates of Examples 1A to 3A, measured at 1 GHz to GHz is also significantly lower than $I_1$ of circuit boards, each of which comprised one of the laminates of Comparative Examples 1A and 2A, measured at 1 GHz to 40 GHz. In addition, for the relative percentage difference between insertion losses ($\Delta I$), $\Delta I$ of circuit boards, each of which comprised one of the laminates of Examples 1A to 3A, measured at 1 GHz to GHz is also significantly lower than $\Delta I$ of circuit boards, each of which comprised one of the laminates of Comparative Examples 1A and 2A, measured at 1 GHz to 40 GHz.

From Tables 2 to 5, $\Delta Df$ of the LCP films in the laminates of Examples 1A to 3A is controlled within a range of no more than 16%, so the water absorption resistance of the circuit boards in a high moisture environment is improved, thereby effectively inhibiting and/or decreasing the insertion loss of the circuit boards at 1 GHz to 40 GHz. Therefore, the circuit boards comprising any of the laminates of Examples 1A to 3A maintain excellent signal transmission capability at various frequency bands before and after water absorption. Similarly, from Tables 1 to 5, it is understood that $\Delta Df$ of the LCP films (raw films) of Examples 1 to 3 is controlled within a range of no more than 16%, so the water absorption resistance of the circuit boards comprising any of the LCP films of Examples 1 to 3 in a high moisture environment is improved, thereby effectively inhibiting and/or decreasing the insertion loss of the circuit boards at 1 GHz to 40 GHz. Therefore, the circuit boards comprising any of the laminates of Examples 1A to 3A maintain excellent signal transmission capability at various frequency bands before and after water absorption.

Figure 1:
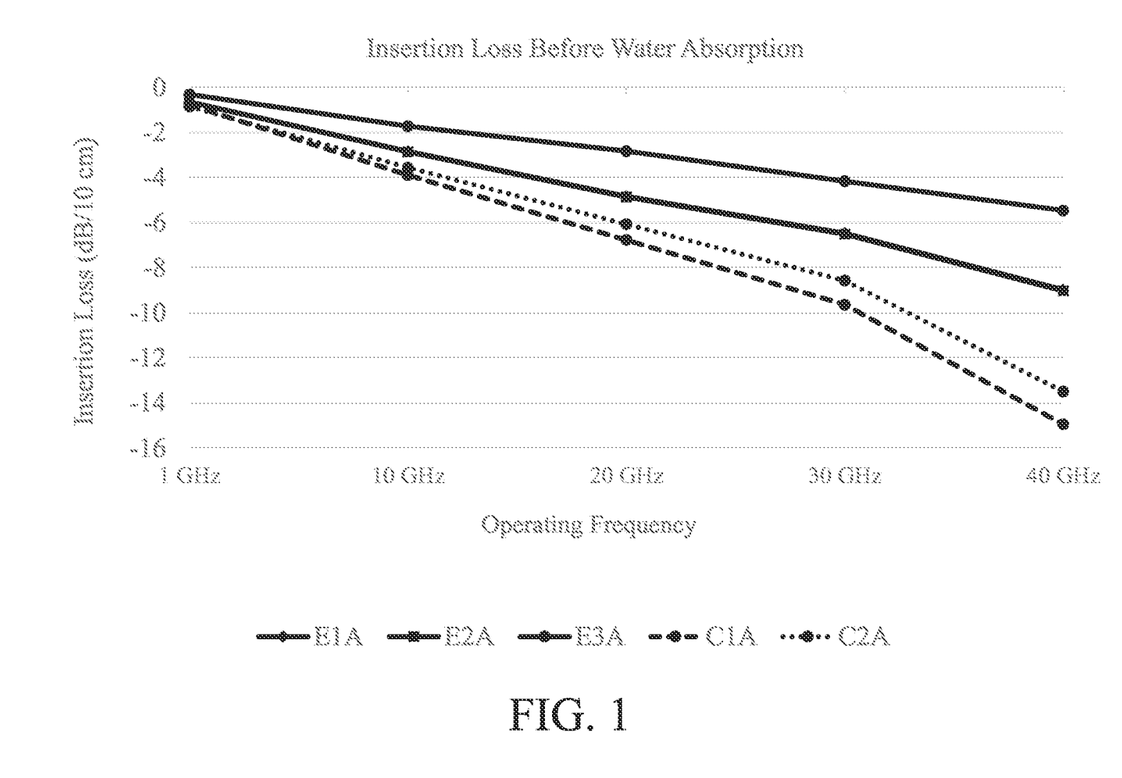
FIG. 1 is a diagram for insertion loss before water absorption of circuit boards at different operating frequencies, wherein each of the circuit boards comprises one of the laminates of Examples 1A to 3A (E1A to E3A) and Comparative Examples 1A and 2A (C1A and C2A).
Figure 2:
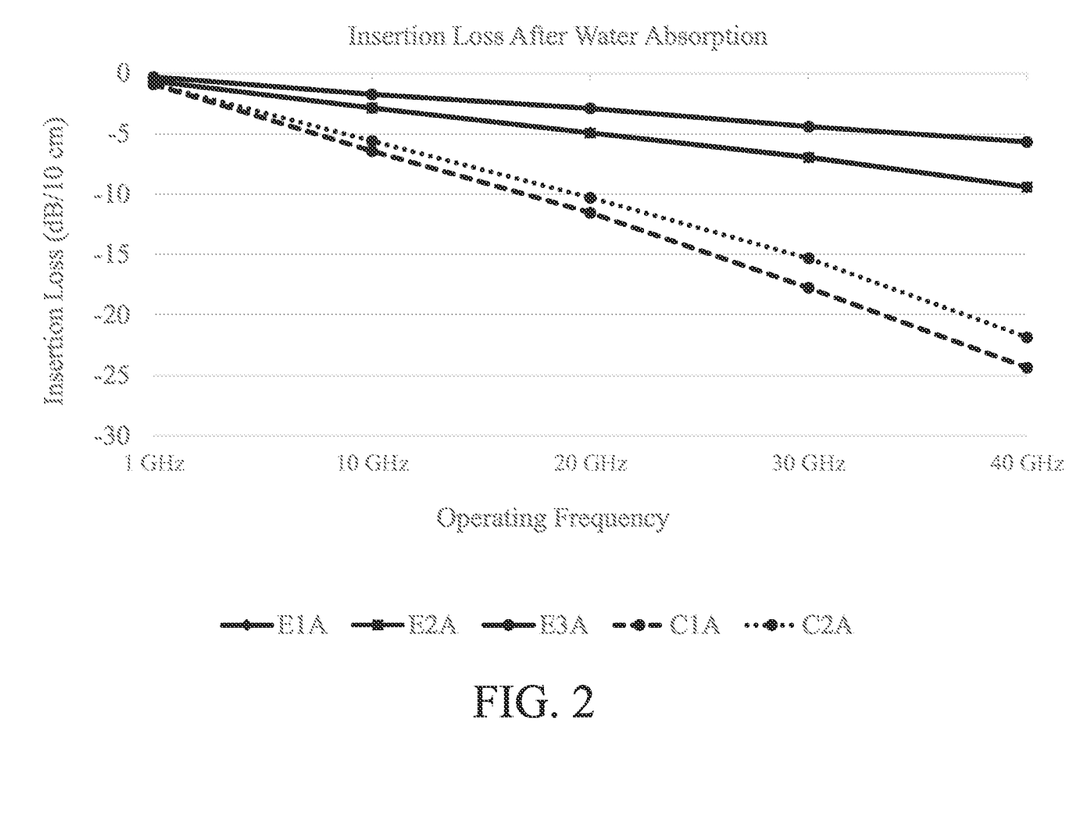
FIG. 2 is a diagram for insertion loss after water absorption of circuit boards at different operating frequencies, wherein each of the circuit boards comprises one of the laminates of E1A to E3A and C1A and C2A.

Insertion loss of circuit boards significantly increases as the operating frequency of signals increases, i.e. the insertion loss is a higher negative value. From insertion loss before water absorption of the circuit boards in the above Table 5 and FIG. 1, it is understood that the slope of insertion loss of the circuit boards comprising any of the laminates of Examples 1A to 3A, which is the ratio of the insertion loss change over the operating frequency change, is flatter than that of the circuit boards comprising any of the laminates of Comparative Examples 1A and 2A, indicating even though the circuit boards comprising any of the laminates of Examples 1A to 3A are operated at a higher frequency, the insertion loss of circuit boards is effectively inhibited and/or decreased. From insertion loss after water absorption of the circuit boards in Table 5 and FIG. 2, it is understood that the slope of insertion loss of the circuit boards comprising any of the laminates of Examples 1A to 3A, which is the ratio of the insertion loss change over the operating frequency change, is also flatter than that of the circuit boards comprising any of the laminates of Comparative Examples 1A and 2A, indicating that even though the circuit boards comprising any of the laminates of Examples 1A to 3A after water absorption are operated at a higher frequency, the insertion loss of circuit boards is effectively inhibited and/or decreased and thus the circuit boards maintain excellent signal transmission capability at high-frequency bands.

Figure 3A:
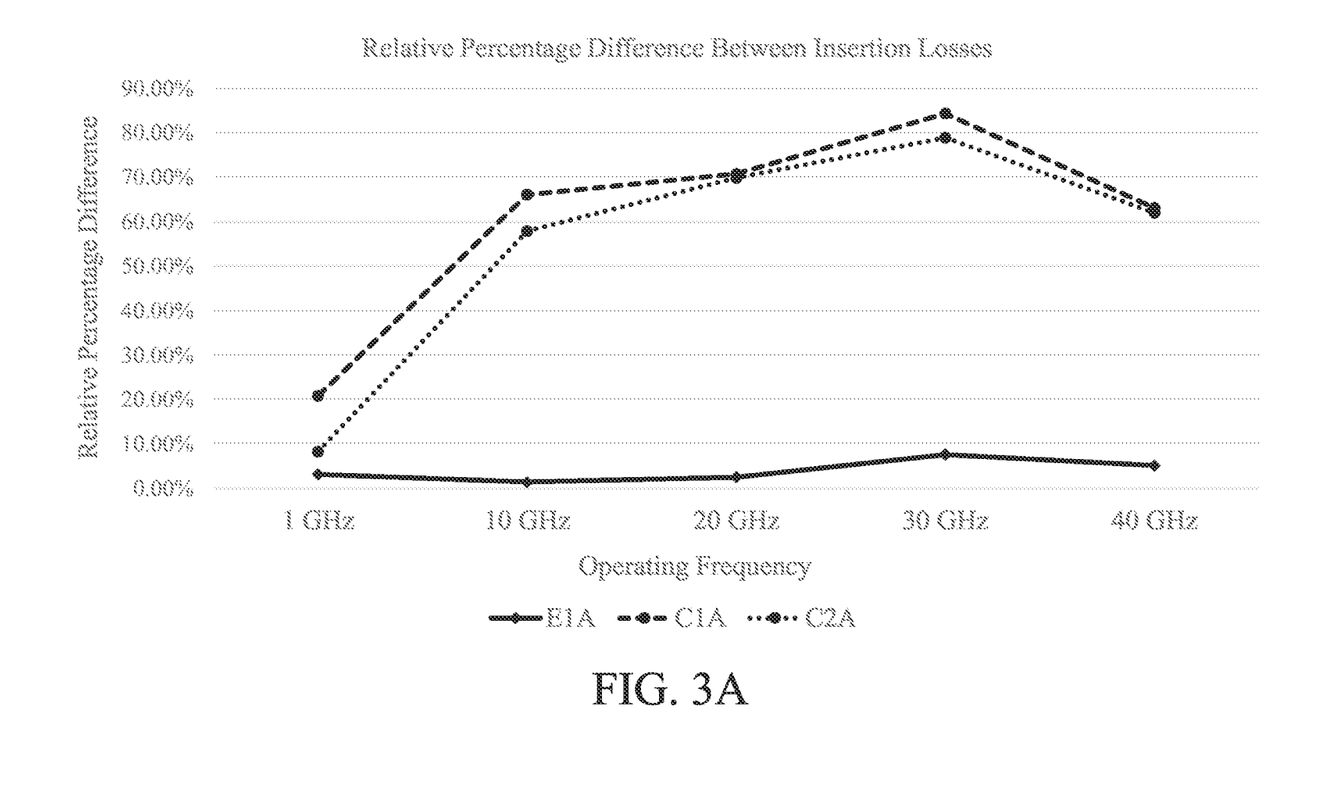
FIG. 3A is a diagram for relative percentage difference between insertion losses before and after water absorption of circuit boards at different operating frequencies, wherein each of the circuit boards comprises one of the laminates of E1A, C1A, and C2A.
Figure 3B:
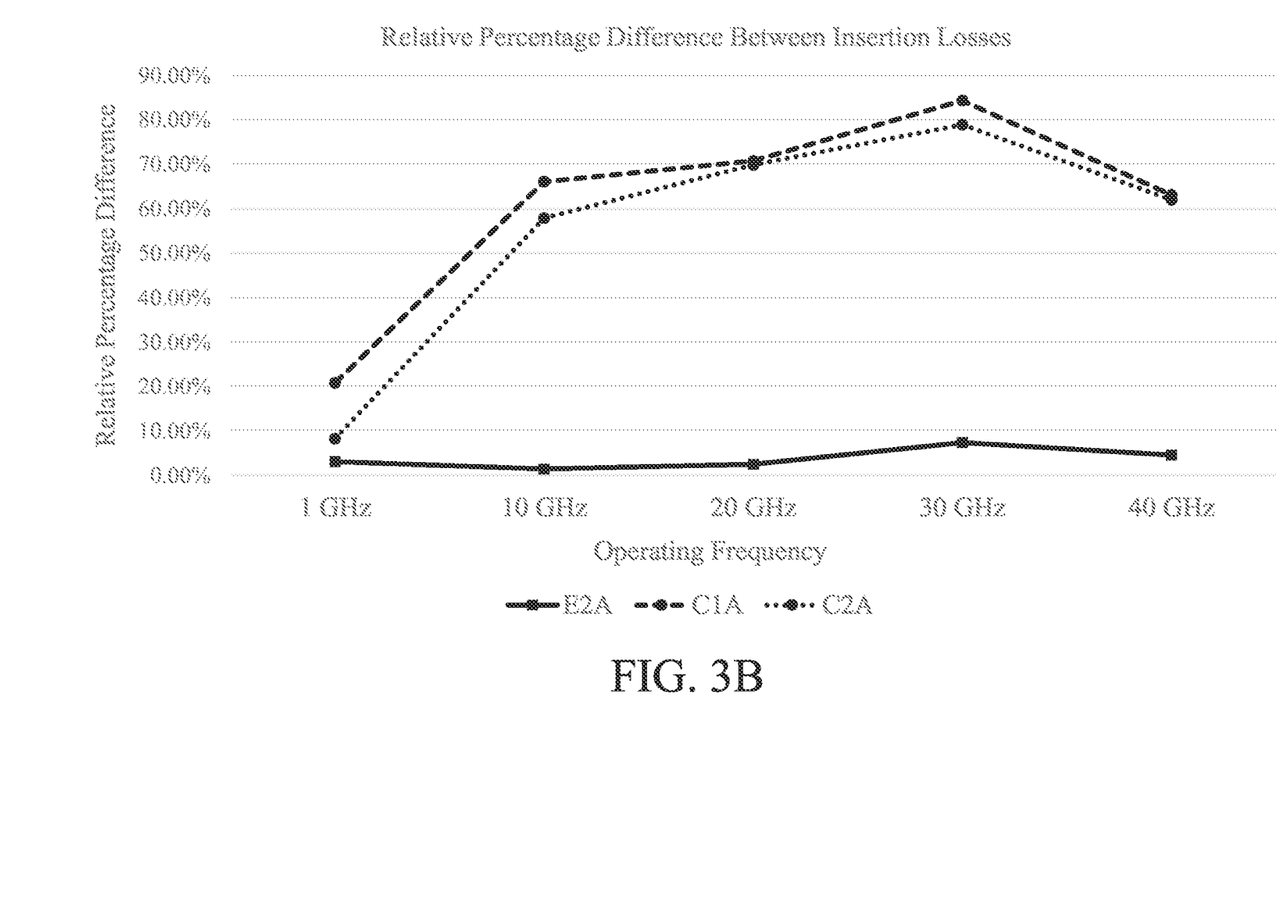
FIG. 3B is a diagram for relative percentage difference between insertion losses before and after water absorption of circuit boards at different operating frequencies, wherein each of the circuit boards comprises one of the laminates of E2A, C1A, and C2A.
Figure 3C:
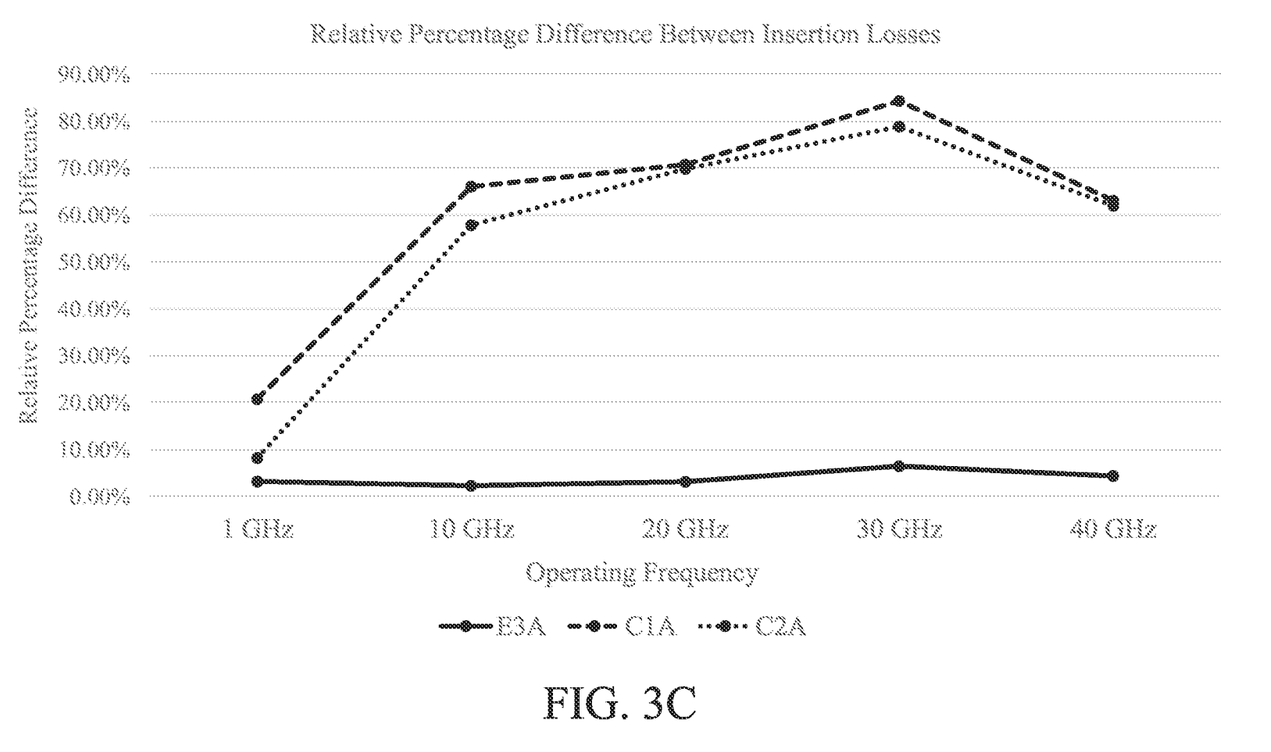
FIG. 3C is a diagram for relative percentage difference between insertion losses before and after water absorption of circuit boards at different operating frequencies, wherein each of the circuit boards comprises one of the laminates of E3A, C1A, and C2A.

In the above Table 5 and FIG. 3A, from the relative percentage difference between insertion losses ($\Delta I$) before and after water absorption of circuit boards, each of which comprised one of laminates of Example 1A and Comparative Examples 1A and 2A, $\Delta I$ at 1 GHz to 40 GHz of the circuit board comprising the laminate of Example 1A is controlled within 10%, whereas $\Delta I$ of the circuit boards—each of which comprised one of the laminates of Comparative Examples 1A and 2A—is about 60% at 10 GHz, about 70% at 20 GHz, about 80% at 30 GHz, and about 60% at 40 GHz. The above results show that the laminate of Example 1A has good water absorption resistance in a high moisture environment because $\Delta Df$ of the LCP film comprised therein is controlled within 16%, thereby effectively inhibiting or decreasing $\Delta I$ at 1 GHz to 40 GHz of the circuit board comprising the laminate of Example 1A. Therefore, the circuit board comprising the laminate of Example 1A maintains excellent signal transmission capability at various frequency bands before and after water absorption. Similarly, from FIG. 3B and FIG. 3C, it is verified that the laminates of Examples 2A and 3A also have good water absorption resistance in a high moisture environment because $\Delta Df$ of the LCP film comprised therein is controlled within 16%, thereby effectively inhibiting or decreasing $\Delta I$ at 1 GHz to 40 GHz of the circuit board comprising one of the laminates of Examples 2A and 3A. Therefore, the circuit board comprising any of the laminates of Examples 2A and 3A maintains excellent signal transmission capability at various frequency bands before and after water absorption.

In summary, by controlling the relative percentage difference between dissipation factors ($\Delta Df$) of the LCP film in the laminate or the relative percentage difference between dissipation factors ($\Delta Df$) of the LCP film (raw film) no more than 16%, the circuit board comprising the laminate of the present application has good water absorption resistance in a high moisture environment. Therefore, the insertion loss before water absorption and the insertion loss after water absorption of circuit boards at 1 GHz to 40 GHz can be decreased, and the relative percentage difference between insertion losses ($\Delta I$) before and after water absorption at 1 GHz to 40 GHz can be effectively inhibited or decreased. Herein, circuit boards of the present application maintain excellent signal transmission capability in low-, medium-, and/or high-frequency bands before or after water absorption, so it is verified that the LCP film and the laminate comprising the LCP film both have excellent moisture resistance and are suitable for various high-end or outdoor electronic products.

Even though numerous characteristics and advantages of the present application have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A laminate, comprising a metal foil and a liquid crystal polymer film, wherein the liquid crystal polymer film is disposed over the metal foil, and the liquid crystal polymer film in the laminate has a dissipation factor before water absorption ($Df'_0$), a dissipation factor after water absorption ($Df'_1$), and a relative percentage difference between dissipation factors ($\Delta Df'$) which is calculated by the following equation:

$$\Delta Df'(\%) = \frac{|Df'_1 - Df'_0|}{Df'_0} \times 100\%;$$

wherein the $\Delta Df'$ is less than or equal to 16%, and
wherein the $Df'_0$ and the $Df'_1$ are respectively measured at 10 GHz before and after the liquid crystal polymer film in the laminate is soaked in pure water at 23° C. for 24 hours for water absorption.

2. The laminate as claimed in claim 1, wherein the $\Delta Df'$ of the liquid crystal polymer film in the laminate is from 5% to 16%.

3. The laminate as claimed in claim 1, wherein the $Df'_0$ of the liquid crystal polymer film in the laminate is from 0.0010 to 0.0030.

4. The laminate as claimed in claim 1, wherein the $Df'_1$ of the liquid crystal polymer film in the laminate is from 0.0011 to 0.0065.

5. The laminate as claimed in claim 1, wherein hygroscopicity of the liquid crystal polymer film in the laminate is less than or equal to 1%.

6. The laminate as claimed in claim 2, wherein hygroscopicity of the liquid crystal polymer film in the laminate is less than or equal to 1%.

7. The laminate as claimed in claim 1, wherein the laminate has a peel strength before water absorption ($F_0$) and a peel strength after water absorption ($F_1$), wherein the $F_0$ and the $F_1$ are respectively measured before and after the laminate is soaked in pure water at 23° C. for 24 hours for water absorption, and wherein $F_0$ is from 0.85 kN/m to 0.95 kN/m and $F_1$ is from 0.85 kN/m to 0.95 kN/m.

8. The laminate as claimed in claim 7, wherein the laminate has a relative percentage difference between peel strengths ($\Delta F$), which is calculated by the following equation:

$$\Delta F(\%) = \frac{|F_1 - F_0|}{F_0} \times 100\%;$$

wherein the $\Delta F$ is less than or equal to 5%.

9. The laminate as claimed in claim 1, wherein the laminate further comprises another metal foil, and the liquid crystal polymer film is sandwiched between the metal foil and said another metal foil.

10. A liquid crystal polymer film, having a dissipation factor before water absorption ($Df_0$), a dissipation factor after water absorption ($Df_1$), and a relative percentage difference between dissipation factors ($\Delta Df$) which is calculated by the following equation:

$$\Delta Df(\%) = \frac{|Df_1 - Df_0|}{Df_0} \times 100\%;$$

wherein the $\Delta Df$ is less than or equal to 16%, and
wherein the $Df_0$ and the $Df_1$ are respectively measured at 10 GHz before and after the liquid crystal polymer film is soaked in pure water at 23° C. for 24 hours for water absorption.

11. The liquid crystal polymer film as claimed in claim 10, wherein the $\Delta Df$ of the liquid crystal polymer film is from 5% to 15%.

12. The liquid crystal polymer film as claimed in claim 10, wherein the $Df_0$ of the liquid crystal polymer film is from 0.0010 to 0.0030.

13. The liquid crystal polymer film as claimed in claim 10, wherein the $Df_1$ of the liquid crystal polymer film is from 0.0011 to 0.0065.

14. A circuit board comprising the liquid crystal polymer film as claimed in claim 10.

* * * * *